(12) United States Patent
Zhu et al.

(10) Patent No.: US 11,219,137 B2
(45) Date of Patent: Jan. 4, 2022

(54) ELECTRONIC DEVICE AND POWER MODULE THEREOF

(71) Applicant: HUIZHOU FLUENCE OPTOELECTRONIC TECHNOLOGY CO., LTD., Huizhou (CN)

(72) Inventors: Yong Zhu, Huizhou (CN); Mingzhu Li, Huizhou (CN); Ronghua Shi, Huizhou (CN); Wei Yue, Huizhou (CN)

(73) Assignee: HUIZHOU FLUENCE OPTOELECTRONIC TECHNOLOGY CO., LTD., Huizhou (CN)

( * ) Notice: Subject to any disclaimer, the term of this patent is extended or adjusted under 35 U.S.C. 154(b) by 0 days.

(21) Appl. No.: 17/133,587

(22) Filed: Dec. 23, 2020

(65) Prior Publication Data

US 2021/0204436 A1  Jul. 1, 2021

(30) Foreign Application Priority Data

Dec. 31, 2019  (CN) .......................... 201922499927.5

(51) Int. Cl.
*H05K 1/02* (2006.01)
*H05K 7/14* (2006.01)
*H05K 1/11* (2006.01)
*H05K 1/18* (2006.01)

(52) U.S. Cl.
CPC ......... *H05K 7/1427* (2013.01); *H05K 1/0203* (2013.01); *H05K 1/111* (2013.01); *H05K 1/181* (2013.01)

(58) Field of Classification Search
CPC .... H05K 7/1427; H05K 1/0203; H05K 1/111; H05K 1/181; H05K 3/28
USPC ........................................................ 361/707
See application file for complete search history.

(56) References Cited

U.S. PATENT DOCUMENTS

| | | | |
|---|---|---|---|
| 4,833,570 A | 5/1989 | Terarani et al. | |
| 2008/0198557 A1* | 8/2008 | Lim | H05K 7/205 361/719 |
| 2009/0057006 A1 | 3/2009 | Kishibate et al. | |
| 2009/0103302 A1 | 4/2009 | Lin et al. | |
| 2009/0273083 A1* | 11/2009 | Sauciuc | H05K 3/3463 257/741 |

(Continued)

FOREIGN PATENT DOCUMENTS

| | | |
|---|---|---|
| DE | 2753145 A1 | 6/1979 |
| DE | 202017006874 U1 | 8/2018 |

OTHER PUBLICATIONS

European Search Report, European application No. 20217469.4, dated Jun. 2, 2021 (6 pages).

*Primary Examiner* — Sherman Ng

(57) ABSTRACT

An electronic device and a power module are provided. The power module includes a power housing; a circuit board, connected to the power housing and arranged with a plurality of pads on a surface of the circuit board facing the power housing; an electronic component, arranged on the circuit board and comprising a plurality of pins; wherein the plurality of pins are soldered and connected to the plurality of pads; and a first sealant layer, arranged on the surface of the circuit board facing the power housing, and covering the plurality of pins and the plurality of pads.

20 Claims, 4 Drawing Sheets

(56) References Cited

U.S. PATENT DOCUMENTS

2014/0198454 A1\* 7/2014 Yuan .................... H01L 25/165
 361/720
2015/0181765 A1\* 6/2015 Hsu ...................... H05K 7/2049
 361/714

\* cited by examiner

ELECTRONIC DEVICE AND POWER MODULE THEREOF

CROSS REFERENCE

The present application claims foreign priority of Chinese Patent Applications No. 201922499927.5, filed on Dec. 31, 2019 in the State Intellectual Property Office of China, the entire contents of which are hereby incorporated by reference.

TECHNICAL FIELD

The present disclosure relates to the field of electronic devices, in particular to an electronic device and a power module thereof.

BACKGROUND

With the widespread application of electronic devices, the number of electronic components arranged on a circuit board in a power module is increasing. Pins of the electronic components are usually soldered on the circuit board. As the use time of the electronic devices is prolonged, the electrical connection between the pins of the electronic component and pads on the circuit board is likely to fail, which may cause damage to the electronic devices.

SUMMARY OF THE DISCLOSURE

The present disclosure provides a power module including: a power housing; a circuit board, connected to the power housing and arranged with a plurality of pads on a surface of the circuit board facing the power housing; an electronic component, arranged on the circuit board and including a plurality of pins; wherein the plurality of pins are soldered and connected to the plurality of pads; and a first sealant layer, arranged on the surface of the circuit board facing the power housing, and covering the plurality of pins and the plurality of pads.

The present disclosure further provides an electronic device, including a power module as described above.

BRIEF DESCRIPTION OF THE DRAWINGS

To further illustrate technical solutions of embodiments of the present disclosure, drawings needed for description of the embodiments will be briefly introduced. Obviously, the following drawings are only some embodiments of the present disclosure. To any one of skill in the art, other drawings may be obtained without any creative work based on the following drawings.

DETAILED DESCRIPTION

Figure 1:
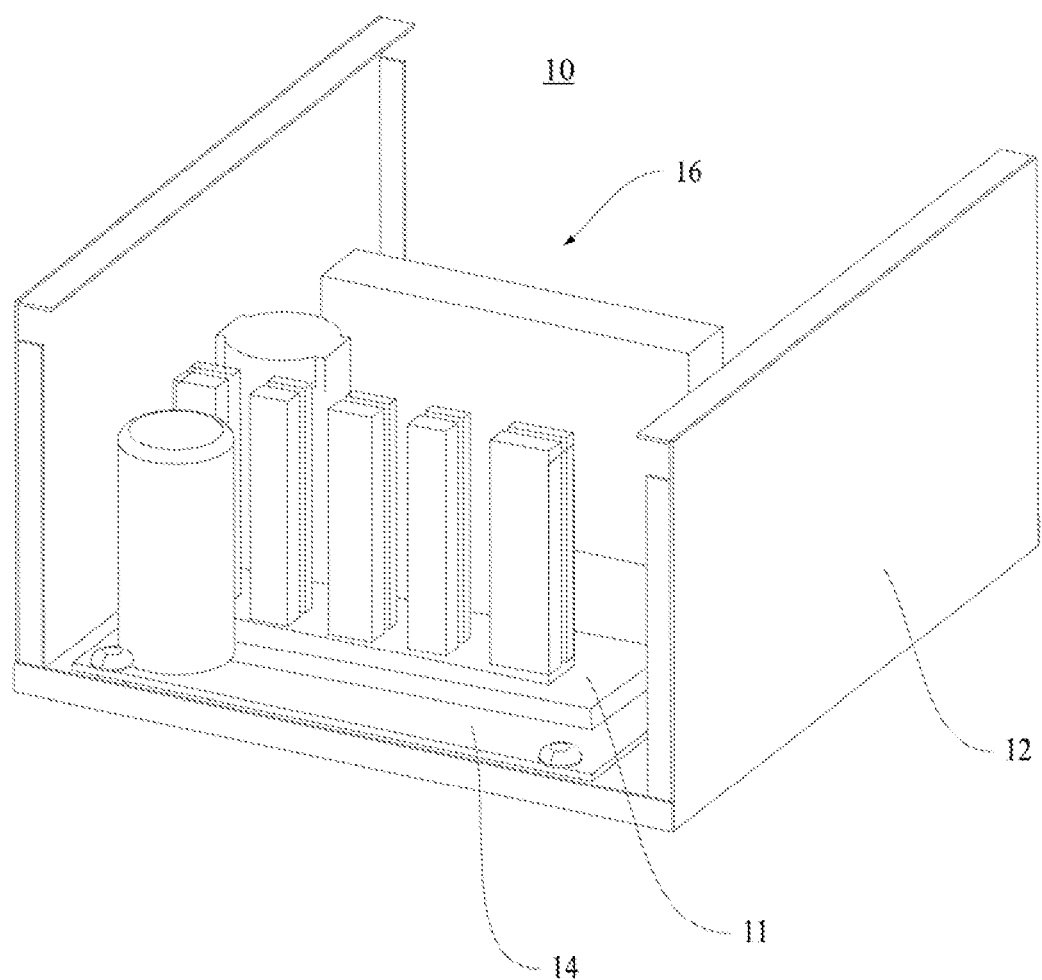
FIG. 1 is a perspective-structural schematic view of a power module according to an embodiment of the present disclosure.

To make any one of skill in the art to understand the technical solutions of the present disclosure, the technical solutions provided by the present disclosure will be described in details by referring to the drawings and the embodiments. Obviously, the described embodiments are only a part of the embodiments, but not all the embodiments of the present disclosure. Based on the described embodiments, all other embodiments obtained by one skilled in the art without creative efforts shall fall within the scope of the present disclosure.

Terms of "first", "second", and "third" in the present disclosure are only for descriptive purposes, and cannot be understood as indicating or implying relative importance or implicitly indicating the number of indicated technical features. Therefore, the features defined with "first", "second", and "third" may explicitly or implicitly include at least one of the features. In the description of the present disclosure, "a plurality of" means at least two, such as two, three, etc., unless otherwise specifically defined. All directional indications (such as up, down, left, right, front, back . . . ) in the embodiments of the present disclosure are only for explaining a relative positional relationship, movement, etc. between the components in a specific posture (as shown in the drawings). When the specific posture changes, the directional indication will change accordingly. In addition, terms of "including" and "having" and any variations thereof are intended to cover non-exclusive inclusion. For example, a process, method, system, product, or device that includes a series of steps or units is not limited to the listed steps or units, but optionally includes unlisted steps or units, or optionally also includes other steps or units inherent in the process, method, product or device.

Reference to "embodiment" herein means that a particular feature, structure, or characteristic described in connection with the embodiment may be included in at least one embodiment of the present disclosure. The appearances of this term in various places in the specification are not necessarily all referring to the same embodiment, nor are they independent or alternative embodiments that are mutually exclusive with other embodiments. It is explicitly and implicitly understood by one skilled in the art that the embodiments described herein may be combined with other embodiments.

Figure 2:
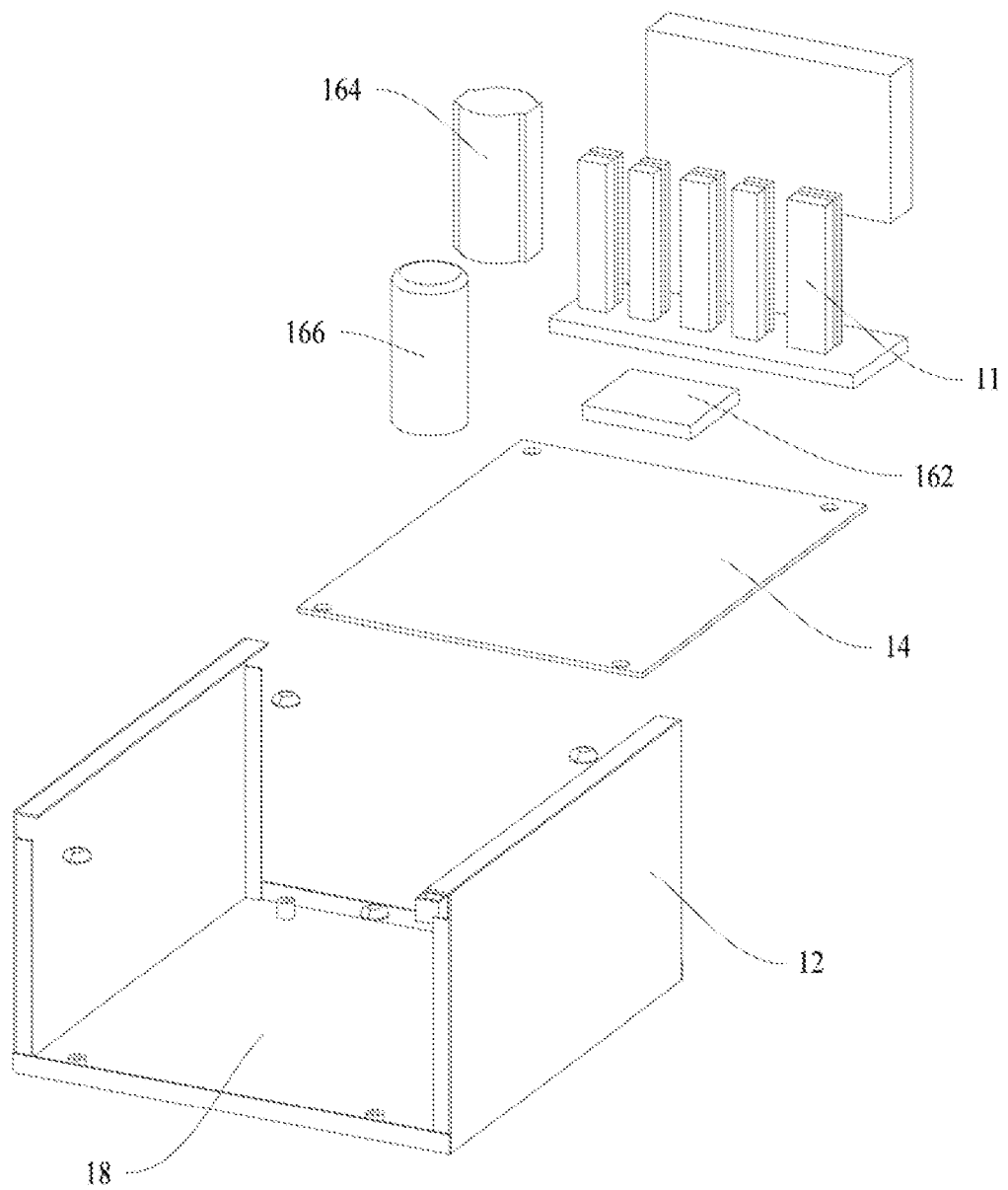
FIG. 2 is an exploded-structural schematic view of the power module shown in the embodiment of FIG. 1.

As shown in FIGS. 1 and 2, FIG. 1 is a perspective-structural schematic view of a power module according to an embodiment of the present disclosure, and FIG. 2 is an exploded-structural schematic view of the power module shown in the embodiment of FIG. 1. The present disclosure provides a power module 10, which is usually applied in an electronic device to supply power to the electronic device.

The power module 10 includes a power housing 12, a circuit board 14, an electronic component 16 and a first sealant layer 18. The circuit board 14 is connected to the power housing 12. A plurality of pads are arranged on a surface of the circuit board 14 facing the power housing 12. The electronic component 16 is arranged on the circuit board 14 and includes pins. The pins are soldered and electrically connected to the plurality of pads. The first sealant layer 18 is arranged on the surface of the circuit board 14 facing the power housing 12 and covers the pins and the plurality of pads.

Figure 5:
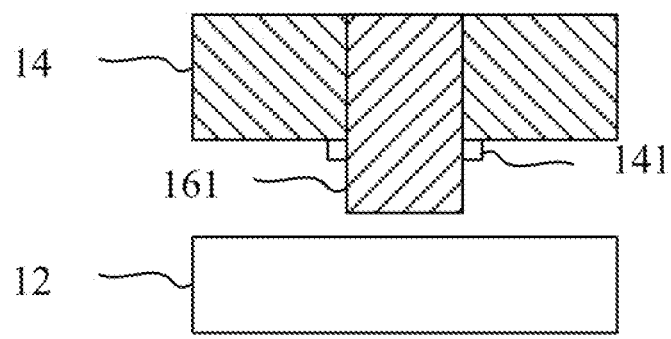
FIG. 5 is an enlarged section-structural schematic view of a matching structure of a pin and a pad according to an embodiment of the present disclosure.
Figure 6:
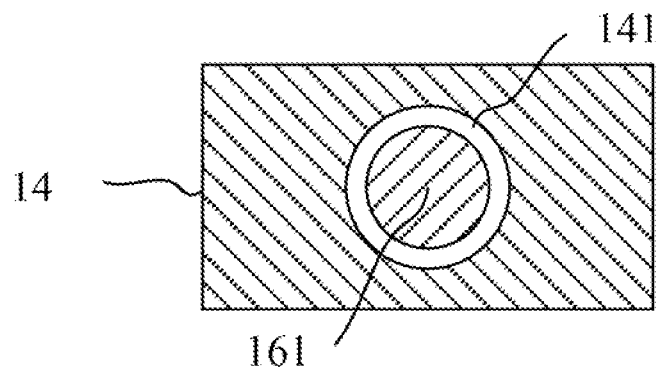
FIG. 6 is an enlarged bottom structural schematic view of a matching structure of a pin and a pad according to an embodiment of the present disclosure.

A match relationship of one pin and one pad may be shown in FIGS. 5 and 6, FIG. 5 is an enlarged section-structural schematic view of a matching structure of a pin and a pad according to an embodiment of the present disclosure. FIG. 6 is an enlarged bottom structural schematic view of a matching structure of a pin and a pad according to an embodiment of the present disclosure. For ease of illustration, the first sealant layer 18 as well as some other elements are omitted. A pin 161 is one of the plurality of pins in the embodiments of the present disclosure. A pad 141 is one of the plurality of pads in the embodiments of the present disclosure. It can be understood that the thickness of the pad 141 may be very small compared with that of the circuit board 14. The shape of the pad 141 and the pin 161 may be set according to needs, which is not limited herein.

In the embodiments of the present disclosure, the plurality of pads are arranged on the surface of the circuit board 14 facing the power housing 12, such that soldering positions of the pins and the pads of the electronic component 16 are located between the circuit board 14 and the power housing 12. In this way, the electronic components 16 arranged on the circuit board 14 may not interfere with the connection between the pins and the pads. The first sealant layer 18 is covered at the connection positions of the pins and the pads. The layer 18 may fix the pins and the pads, such that the pins may not loosen to the pads and ensure a success connection. The first sealant layer 18 may also be moisture-proof, such that the pins or pads may not corrode. The first sealant layer 18 may also be insect-proof, such that small-sized insects may not enter the power housing 12 and the pins or pads are to be protected, thereby ensuring the success connection between the electronic component 16 and the circuit board 14. In this way, a solder stability between the pins of the electronic component 16 and the pads on the board 14 is enhanced, improving an electrical connection stability between the pins of the electronic component 16 and the pads on the circuit board 14.

In the embodiments, the circuit board 14 may usually be configured as a rigid circuit board to support the electronic component 16. Or, in other embodiments, the circuit board 14 may also be a flexible-hard combination board, etc., which is not specifically limited herein In some embodiments, as shown in FIG. 2, the electronic component 16 may include an integrated chip 162, a capacitor 164 and a resistor 166. The circuit board 14 is arranged with conductive lines (not shown). The integrated chip 162 is connected to the capacitor 164 and the resistor 166 through the conductive lines. The first sealant layer 18 covers the conductive lines.

Specifically, the conductive lines may be prepared by etching a metal layer on the circuit board 14. Specific forming methods thereof may be referred to the prior art, which is not specifically limited herein. The electronic component 16 such as the integrated chip 162, the capacitor 164 and the resistor 166 may be arranged on the circuit board 14. The pins of the electronic component 16 are electrically connected with the conductive lines to form an integrated circuit such as power-supply integrated circuit and filtering integrated circuit, which is not limited herein. The first sealant layer 18 is arranged to cover the conductive lines, such that the conductive lines may not be rusted and disconnected or damaged by insects due to the protective effect of the first sealant layer 18 on the conductive lines, thereby prolonging the service life of the circuit board 14. In addition, the first sealant layer 18 may also insulate the conductive circuit from external circuits, such that the conductive circuit may not be connected to other circuits causing short circuits.

Figure 3:
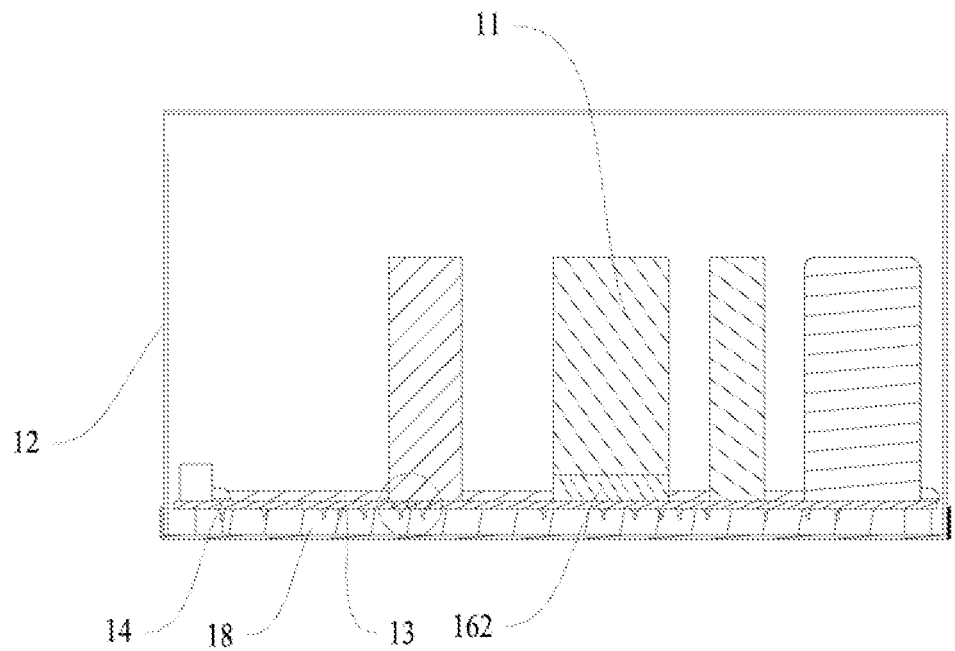
FIG. 3 is a section-structural schematic view of the power module shown in the embodiment of FIG. 1.

Further, as shown in FIGS. 2 and 3, FIG. 3 is a sectionstructural schematic view of the power module shown in the embodiment of FIG. 1. The power module 10 further includes a heat dissipation assembly 11 in contact with the integrated chip 162 for dissipating heat for the integrated chip 162.

Specifically, as shown in FIGS. 2 and 3, the heat dissipation assembly 11 is connected to the circuit board 14, and the integrated chip 162 is sandwiched in a gap between the circuit board 14 and the heat dissipation assembly 11 to dissipate heat for the integrated chip 162.

Since the integrated chip 162 generates a large amount of heat during operation, the temperature of the integrated chip 162 may increase due to the heat. The increase in the temperature of the integrated chip 162 will reduce the operating speed of the electronic device. When the temperature is high enough, the integrated chip 162 may be burned out. Therefore, in the embodiments of the present disclosure, the heat dissipation assembly 11 for dissipating heat for the integrated chip 162 is arranged on the circuit board 14 to improve the heat dissipation performance of the integrated chip 162, thereby protecting the integrated chip 162 from damages to the electronic device.

The heat dissipation assembly 11 may include a plurality of heat dissipation fins. The plurality of heat dissipation fins are arranged in parallel and spaced apart to form a heat dissipation channel between adjacent heat dissipation fins, thereby increasing the heat dissipation rate of the integrated chip 162.

Of course, in other embodiments, the heat dissipation assembly 11 may also include a liquid-cooled radiator or a fan for heat dissipation, which is not specifically limited herein.

Further, as shown in FIG. 3, the first sealant layer 18 may be a thermal conductive glue and be connected to the power housing 12 and the circuit board 14 respectively, such that a heat conduction of the power housing 12 and the circuit board 14 is achieved via the first sealant layer 18.

Specifically, an end of the first sealant layer 18 is connected to the power housing 12, and the other end of the first sealant layer 18 is connected to the circuit board 14, thereby thermally connecting the power housing 12 and the circuit board 14. Since the heat conduction efficiency of the thermal conductive glue is higher than that of air, the thermal conductive glue is sandwiched between the power housing 12 and the circuit board 14 to facilitate the transfer of heat on the circuit board 14 to the power housing 12 with a larger surface area. In this way, the power housing 12 may be configured to perform the heat dissipation for the circuit board 14, thereby improving the heat dissipation performance of the power module 10.

In some embodiments, the first sealant layer 18 may be arranged partially corresponding to the positions of the pads and pins. The first sealant layer 18 may also be evenly filled in the gap between the power housing 12 and the circuit board 14. In this way, a contact area between the thermal conductive glue and the circuit board 14 and the power housing 12 may be increased, further improving the heat dissipation performance of the power supply module 10.

Furthermore, as shown in FIG. 3, the power module 10 may further include a second sealant layer 13 covering a surface of the circuit board 14 facing away from the power housing 12.

Specifically, the second sealant layer 13 is arranged on the surface of the circuit board 14 facing away from the power housing 12. The second sealant layer 13 defines a vacancy at a position corresponding to the electronic component 16 to facilitate an electrical connection between the electronic component 16 and the circuit board 14.

In some embodiments, the first sealant layer 18 is coated on the surface of the circuit board 14 with a uniform thickness, such that dust and other debris may not fall into the gap between the electronic components 16, thereby improving a dustproof effect of the power module 10.

Figure 4:
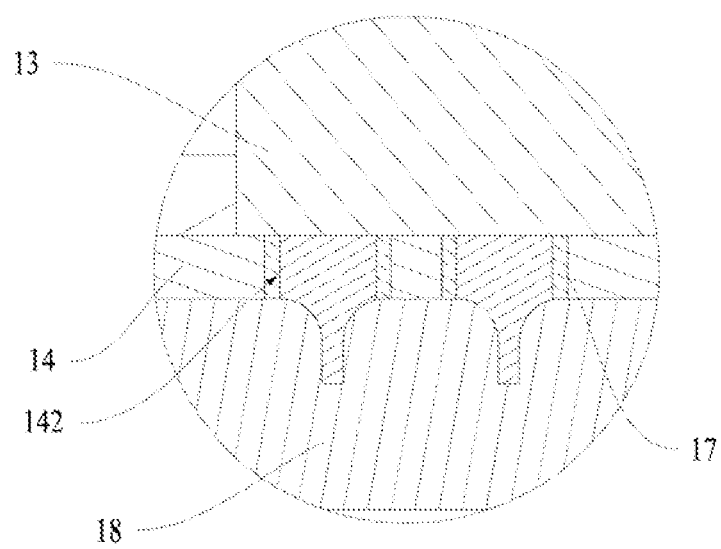
FIG. 4 is a partial-enlarged schematic view of the structure shown in FIG. 3.

Further, as shown in FIG. 3 and FIG. 4, FIG. 4 is a partial-enlarged schematic view of the structure shown in FIG. 3. The circuit board 14 may define at least one through hole 142. The pins may pass through the through hole 142 and be soldered to the pads.

Specifically, the circuit board 14 defines the through hole 142 for shunning the pins. By defining the through holes 142 for shunning the pins on the circuit board 14, the length of the wiring between the pins and the pads may be reduced, thereby reducing a signal transmission loss and improving the performance of the power module 10.

Further, the power module 10 may further include a third sealant layer 17 sandwiched between the pins and an inner wall of the through hole 142. The third sealant layer 17 is sandwiched between the pins and the inner wall of the through hole 142, such that the pins may not shake relative to the circuit board 14 due to a fixing function of the third sealant layer 17 to the pins. In this way, a stability of electrical connection with the pins and pads are improved.

In the embodiments, as shown in FIG. 4, the first sealant layer 18, the second sealant layer 13, and the third sealant layer 17 may be integrally formed. With the above solution, a production process of the power module 10 may be simplified to improve a production efficiency of the power module 10. For example, a glue potting process may be applied. A molten thermally conductive glue may be poured into the inside of the power housing 12 from a glue hole. The molten thermally conductive glue will form the integrated first sealant layer 18, second sealant layer 13 and third sealant layer 17 after cooling.

Of course, in other embodiments, the first sealant layer 18, the second sealant layer 13, and the third sealant layer 17 may also be integrally formed by other processing methods, which are not specifically limited herein.

In some embodiments, the first sealant layer 18 is at least one of gray glue, white glue, and epoxy resin. For example, in the embodiments, the first sealant layer 18 may be a mixture of gray glue and white glue. Specifically, the first sealant layer 18 may include 50% gray glue and 50% white glue. In other embodiments, the first sealant layer 18 may also be epoxy resin, etc., which is not specifically limited in the embodiments of the present disclosure, and may be flexibly configured according to needs.

In another embodiment of the present disclosure, an electronic device is also provided. The electronic device includes a power module.

The structure of the power module in the embodiment is the same as the structure of the power module in the foregoing embodiments, which may be referred to the description in the foregoing embodiments and will not be repeated here.

In some embodiments, the electronic device may be a desktop computer host, a television, a refrigerator, a washing machine, and other electrical appliances, which are not specifically limited herein.

In summary, those skilled in the art can easily understand that by arranging the plurality of pads on the surface of the circuit board 14 facing the power housing 12, the pins of the electronic component 16 and the pads may be soldered between the circuit board 14 and the power housing 12, such that the electronic component 16 arranged on the circuit board 14 may not interfere with the connection between the pins and the pads. The first sealant layer 18 is coveringly arranged at the connection position of the pins and the pads. The first sealant layer 18 may fix the pins and the pads, such that the pins may not loosen relative to the pads causing the connection failure. The first sealant layer 18 may also be moisture-proof, such that the pins or pads may not corrode. The first sealant layer 18 may also be insect-proof, such that small-sized insects may not enter the power housing 12 and the pins or pads are to be protected, thereby ensuring the success connection between the electronic component 16 and the circuit board 14. In this way, a solder stability between the pins of the electronic component 16 and the pads on the board 14 is enhanced, improving an electrical connection stability between the pins of the electronic component 16 and the pads on the circuit board 14.

The above description is for the purpose of illustrating implementations of the present disclosure, but not to limit the scope of the present disclosure. Any equivalent structural or process transformation performed based on the drawings and the specification of the present disclosure, applied directly and indirectly in other related art, should be within the scope of the present disclosure.

What is claimed is:

1. A power module, comprising:
   a power housing;
   a circuit board, connected to the power housing and arranged with a plurality of pads on a surface of the circuit board facing the power housing;
   an electronic component, arranged on the circuit board and comprising a plurality of pins; wherein the plurality of pins are soldered and connected to the plurality of pads; and
   a first sealant layer, arranged on the surface of the circuit board facing the power housing, and covering the plurality of pins and the plurality of pads.

2. The power module according to claim 1, wherein the first sealant layer is made of a thermal conductive glue, the first sealant layer is connected to the power housing and the circuit board respectively, such that a heat conduction of the power housing and the circuit board is achieved via the first sealant layer.

3. The power module according to claim 2, wherein the first sealant layer is evenly filled in a gap between the power housing and the circuit board.

4. The power module according to claim 2, wherein the first sealant layer is arranged partially corresponding to positions of the plurality of pins and the plurality of pads.

5. The power module according to claim 1, further comprising a second sealant layer covering a surface of the circuit board facing away from the power housing.

6. The power module according to claim 5, wherein the second sealant layer defines a vacancy at a position corresponding to the electronic component to facilitate an electrical connection between the electronic component and the circuit board.

7. The power module according to claim 5, wherein the circuit board defines a plurality of through holes; the plurality of pins pass through the plurality of through holes and are soldered to the plurality of pads.

8. The power module according to claim 5, further comprising a third sealant layer sandwiched between one of the plurality of pins and an inner wall of one of the plurality of through holes.

9. The power module according to claim 8, wherein the first sealant layer, the second sealant layer, and the third sealant layer are integrally formed.

10. The power module according to claim 1, wherein the first sealant layer is at least one of gray glue, white glue, and epoxy resin.

11. The power module according to claim 1, wherein the electronic component comprises an integrated chip, a capacitor and a resistor; the circuit board is arranged with conductive lines; the integrated chip is connected to the capacitor and the resistor through the conductive lines; the first sealant layer covers the conductive lines.

12. The power module according to claim 11, further comprising a heat dissipation assembly in contact with the integrated chip for dissipating heat for the integrated chip.

13. The power module according to claim 12, wherein the heat dissipation assembly is connected to the circuit board, the integrated chip is sandwiched in a gap between the circuit board and the heat dissipation assembly.

14. The power module according to claim 12, wherein the heat dissipation assembly comprises a plurality of heat dissipation fins; the plurality of heat dissipation fins are arranged in parallel and spaced apart to form a heat dissipation channel between adjacent heat dissipation fins.

15. An electronic device, comprising a power module; wherein the power module comprises:
 a power housing;
 a circuit board, connected to the power housing and arranged with a plurality of pads on a surface of the circuit board facing the power housing;
 an electronic component, arranged on the circuit board and comprising a plurality of pins;
 wherein the plurality of pins are soldered and connected to the plurality of pads; and
 a first sealant layer, arranged on the surface of the circuit board facing the power housing, and covering the plurality of pins and the plurality of pads.

16. The power module according to claim 15, further comprising a second sealant layer covering a surface of the circuit board facing away from the power housing.

17. The power module according to claim 16, further comprising a third sealant layer sandwiched between one of the plurality of pins and an inner wall of one of the plurality of through holes.

18. The power module according to claim 15, wherein the electronic component comprises an integrated chip, a capacitor and a resistor; the circuit board is arranged with conductive lines; the integrated chip is connected to the capacitor and the resistor through the conductive lines; the first sealant layer covers the conductive lines.

19. The power module according to claim 18, further comprising a heat dissipation assembly in contact with the integrated chip for dissipating heat for the integrated chip.

20. The power module according to claim 19, wherein the heat dissipation assembly is connected to the circuit board, the integrated chip is sandwiched in a gap between the circuit board and the heat dissipation assembly.

* * * * *